(12) United States Patent
Pamulaparthy et al.

(10) Patent No.: US 12,087,528 B2
(45) Date of Patent: Sep. 10, 2024

(54) ENHANCED SWITCHGEAR MONITORING AND DIAGNOSTICS IN A PROTECTION RELAY

(71) Applicant: General Electric Technology GmbH, Baden (CH)

(72) Inventors: Balakrishna Pamulaparthy, Hyderabad (IN); Palak Praduman Parikh, Markham (CA); Michael Pilon, Markham (CA)

(73) Assignee: GE INFRASTRUCTURE TECHNOLOGY LLC, Greenville, SC (US)

( * ) Notice: Subject to any disclaimer, the term of this patent is extended or adjusted under 35 U.S.C. 154(b) by 96 days.

(21) Appl. No.: 17/164,804

(22) Filed: Feb. 1, 2021

(65) Prior Publication Data
US 2022/0246378 A1 Aug. 4, 2022

(51) Int. Cl.
*H01H 47/00* (2006.01)
*G01R 31/327* (2006.01)

(52) U.S. Cl.
CPC ....... *H01H 47/002* (2013.01); *G01R 31/3275* (2013.01)

(58) Field of Classification Search
None
See application file for complete search history.

(56) References Cited

U.S. PATENT DOCUMENTS

| | | | | |
|---|---|---|---|---|
| 4,972,290 | A | * 11/1990 | Sun | .......................... H02H 3/04 361/81 |
| 9,146,278 | B2 | 9/2015 | Valdes et al. | |
| 9,378,901 | B2 | 6/2016 | Ashtekar et al. | |
| 10,175,299 | B2 | 1/2019 | Gould et al. | |
| 10,408,877 | B2 | 9/2019 | Zhuang et al. | |
| 2002/0024782 | A1* | 2/2002 | Kim | ......................... H02H 3/04 361/42 |

(Continued)

FOREIGN PATENT DOCUMENTS

| | | |
|---|---|---|
| CN | 202013408 U | 10/2011 |
| CN | 103018666 A | 4/2013 |

(Continued)

OTHER PUBLICATIONS

Gopalakrishnan et al.; A Method for Configuring an Intelligent Electronic Device and a System Therof; EP 3748811 A1; Date of Publication: Sep. 12, 2020; CPCI: H 02 J 13/00036 (Year: 2020).*

(Continued)

*Primary Examiner* — Nasima Monsur
(74) *Attorney, Agent, or Firm* — Eversheds Sutherland (US) LLP

(57) ABSTRACT

Systems, methods, and computer-readable media are used for monitoring and diagnosing power system assets. An example of a power system asset may include an individual circuit breaker, a switchgear that may include multiple circuit breakers, or any other asset that may be included in a power system. A system for monitoring and diagnosing these power system assets may include one or more intelligent protection relay and switchgear monitor device(s) that may be communicatively coupled in a master-slave or peer-peer configuration in a time-synchronized manner of operation.

20 Claims, 5 Drawing Sheets

(56) References Cited

U.S. PATENT DOCUMENTS

| | | | |
|---|---|---|---|
| 2010/0023309 A1* | 1/2010 | Radibratovic | G05B 17/02 |
| | | | 703/13 |
| 2011/0128005 A1* | 6/2011 | Weiher | H02H 3/044 |
| | | | 324/424 |
| 2016/0180687 A1 | 6/2016 | Schroeder et al. | |
| 2016/0349309 A1 | 12/2016 | Schellekens et al. | |
| 2017/0047174 A1 | 2/2017 | Chen et al. | |
| 2017/0141559 A1 | 5/2017 | Blumschein et al. | |
| 2017/0287666 A1 | 10/2017 | Tanigaki et al. | |
| 2019/0018065 A1 | 1/2019 | Lapiere et al. | |
| 2019/0079134 A1 | 3/2019 | Donolo et al. | |

FOREIGN PATENT DOCUMENTS

| | | |
|---|---|---|
| EP | 2883068 A1 | 6/2015 |
| EP | 2817815 B1 | 5/2016 |
| EP | 3031107 A1 | 6/2016 |
| EP | 3091628 A1 | 11/2016 |
| EP | 3171473 A1 | 5/2017 |
| EP | 3293853 A1 | 3/2018 |
| EP | 2579057 B1 | 12/2018 |
| EP | 3748811 A1 | 12/2020 |
| KR | 20080108553 A | 10/2008 |
| WO | 2007109679 A2 | 9/2007 |
| WO | 2010009479 A2 | 1/2010 |
| WO | 2016035131 A1 | 3/2016 |
| WO | 2017116655 A1 | 7/2017 |
| WO | 2018232558 A1 | 12/2018 |
| WO | 2019179613 A1 | 9/2019 |

OTHER PUBLICATIONS

Extended European Search Report issued in EP Application No. 22154247.5, dated Jun. 14, 2022, 9 pages.

* cited by examiner

ENHANCED SWITCHGEAR MONITORING AND DIAGNOSTICS IN A PROTECTION RELAY

TECHNICAL FIELD

The disclosure relates to power systems, and, more particularly, to, systems and methods for providing enhanced switchgear monitoring and diagnostics in a protection relay.

BACKGROUND

Utility segments may be responsible for the generation, transmission, and distribution of electricity. Electric utilities include investor-owned and publicly-owned cooperatives and nationalized entities, which may be the primary providers of electricity in most of the countries, worldwide. On the other hand, increasing laws supporting reliable, uninterrupted power supply are increasingly being adopted in regions such as North America and Europe, which are driving the market for switchgear monitoring systems.

BRIEF DESCRIPTION OF THE DRAWINGS

The detailed description is set forth with reference to the accompanying drawings. The drawings are provided for purposes of illustration only and merely depict example embodiments of the disclosure. The drawings are provided to facilitate understanding of the disclosure and shall not be deemed to limit the breadth, scope, or applicability of the disclosure. In the drawings, the left-most digit(s) of a reference numeral may identify the drawing in which the reference numeral first appears. The use of the same reference numerals indicates similar, but not necessarily the same or identical components. However, different reference numerals may be used to identify similar components as well. Various embodiments may utilize elements or components other than those illustrated in the drawings, and some elements and/or components may not be present in various embodiments. The use of singular terminology to describe a component or element may, depending on the context, encompass a plural number of such components or elements and vice versa.

DETAILED DESCRIPTION

Figure 1:
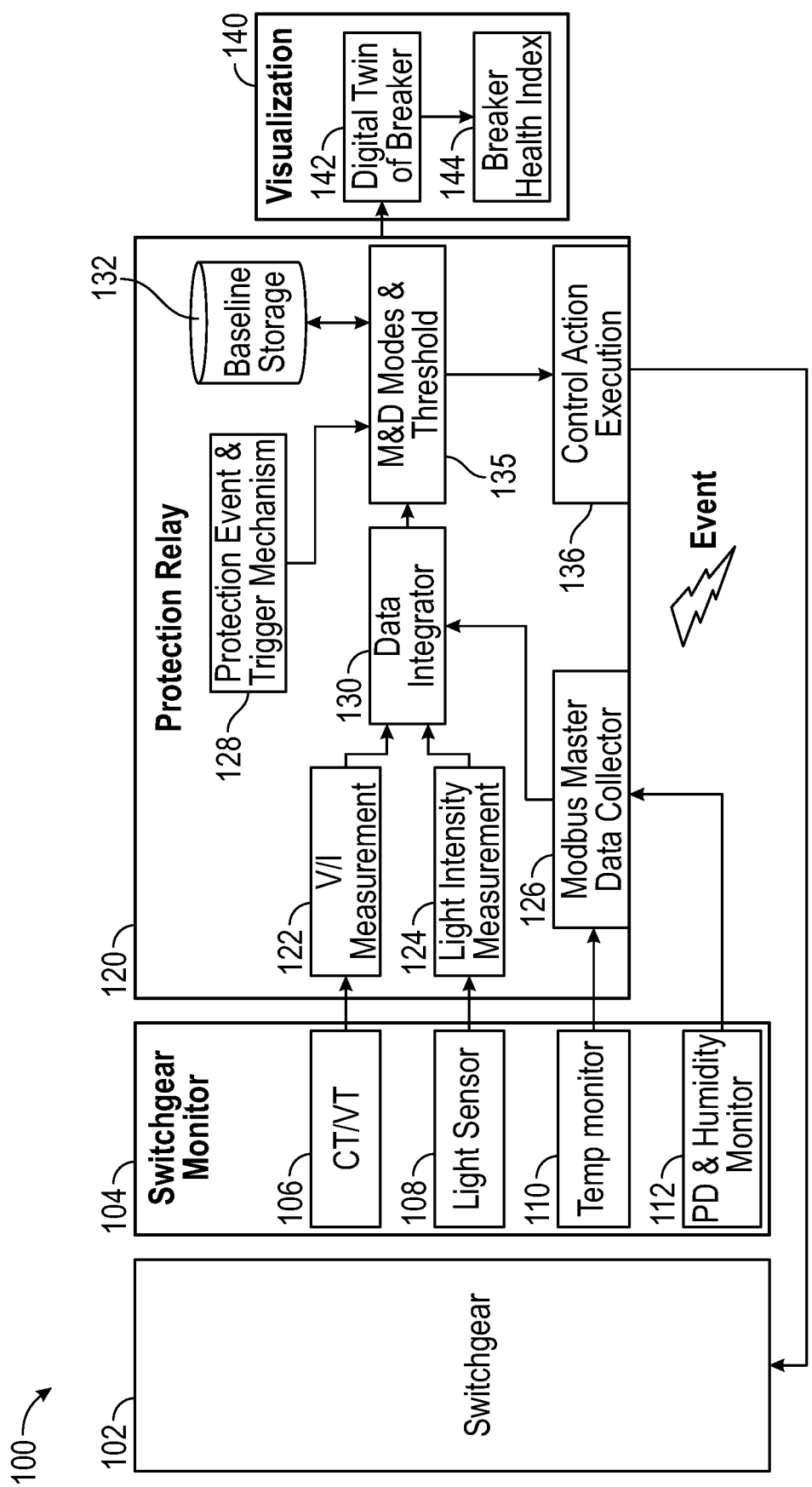
FIG. 1 depicts a schematic illustration of an example system, in accordance with one or more example embodiments of the disclosure.

This disclosure may relate to, among other things, systems and methods for providing enhanced switchgear monitoring and diagnostics in a protection relay. In certain embodiments, systems and methods for monitoring and diagnosing power system assets can be provided. An example of a power system asset may include an individual circuit breaker, a switchgear that may include multiple circuit breakers, or any other asset that may be included in a power system. A system for monitoring and diagnosing these power system assets may include one or more intelligent protection relay and switchgear monitor device(s) that may be communicatively coupled in a master-slave or peer-peer configuration in a time-synchronized manner of operation. For example, the protection relay may serve as the master device and may provide instructions to the switchgear monitor (for example, the protection relay may request data from the switchgear monitor). Intelligent protection relays may provide high performance protection, high density inputs and outputs (I/O), extensive programmable logic, and flexible configuration capabilities. With protection and control logic, such a protection relay may allow for simplified coordination with upstream and downstream disconnect devices (e.g., one or more circuit breakers in the power system). The protection relay may itself also have the capability to monitor a switchgear in the power system that may house the one or more circuit breakers. For example, the protection relay may allow for electrical characteristics to be monitored during trip events. A specific switchgear monitor device may also be able to provide additional information, such as partial discharge data, temperature, and humidity data, to name a few examples. The combination of the protection relay and the switchgear monitor in this manner may allow for enhanced monitoring of the switchgear (in some cases, reference may be made herein to only a "breaker" or a "switchgear," but the systems and methods described herein may similarly apply to either of the breaker or switchgear, or any other power system asset as well).

In some embodiments, an algorithm employed by the protection relay in this configuration may include at least two modes of operation: a baselining mode and a monitoring mode. The baselining mode may take place when the switchgear is under healthy operation and/or newly commissioned. The baselining mode may involve initial data collection that may be used to establish baseline operational data (for example, "healthy" operational data) for a switchgear. The baselining mode may also involve establishing a data correlation model that may subsequently be used for estimating certain parameters of the switchgear to predict future problems with the switchgear, such as asset degradation and/or potential for fault events, such as a breaker trip).

During the baselining mode, some data may be captured continuously and some data may be captured at specific instances (for example, at a breaker trip event). For example, protection function data which triggered an event (where an event may be any abnormal condition like fault in the power system such as overload, short circuit, over current, over voltage, etc.), peak fault current, peak voltage, a duration of fault, arcing current and/or energy within the protection relay, a partial discharge (PD) level, temperature, humidity, and/or an operating time of the breaker, are examples of data which may be captured continuously. Additionally, for some or all breaker trip events, peak fault current, duration of the fault, arcing energy, humidity level, and/or duration of the fault may also be obtained. Based on this data captured during some or all of the breaker trip events, breaker operating times, partial discharge level and rise, and/or temperature rise over ambient may be determined. Once a given number of data samples have been captured, a data correlation model may be established. The data correlation model may be a model that, once established, may subsequently be used to estimate a breaker operating time, partial discharge level and/or rise, and a temperature rise over an ambient temperature for any provided data inputs (for example, peak fault current, a duration of the fault, an arcing energy, a humidity level, and/or a duration of the fault as inputs). The data correlation model may be established using artificial intelligence, machine learning, neural networks, or the like, for example, and may be based on the data samples obtained during the baselining mode. Additionally, based on the data obtained during the baselining mode, operational thresholds may be extracted (for example, using methods such as statistical theory, clustering techniques etc.) for the operation of the breaker (and/or switchgear as a whole). For example, the thresholds may be used to determine when a breaker failure or performance degradation has occurred or is likely to occur in near future. Thresholds may be extracted specific to each breaker based on its design, rating, type etc.

In some embodiments, once the baseline data is obtained and the data correlation model is established, the protection relay algorithm may automatically transition to a monitoring mode. During the monitoring mode, the protection relay may continue to collect (and/or instruct the switchgear monitor to collect and provide) the same or similar types of data collected during the baselining mode. That is, the protection relay may continue to obtain data pertaining to, for example, peak fault current, duration of fault, arcing energy, arcing current, humidity level data of an event (trip), as well as any other data mentioned herein. Additionally, based on this data, estimated values of switchgear operating time, PD level, and temperature rise over ambient may be determined using the data correlation model and may be stored in memory (which may be local memory of the protection relay). At the same time, actual measured data for switchgear operating time, PD level, and temperature rise over ambient may also be obtained. As the estimated and measured data is being collected and stored during this monitoring mode, the protection relay may compute deviations between different data sets. For example, measured breaker operating time data may be compared to expected breaker operating time data, and measured breaker operating time data may be compared to threshold levels. Additionally, measured temperature rise over ambient data may be compared to expected temperature rise over ambient data, and measured temperature rise over ambient data may be compared to threshold levels. Finally, measured partial discharge level rise data may be compared to expected partial discharge level rise data, and measured partial discharge level rise data may be compared to threshold levels. These comparisons may then be used to detect breaker anomalies and/or predict breaker failure/degradation. In some cases, a continuous breaker health index, an event-based (e.g., breaker trip) breaker health index, and a breaker deterioration index may also be determined. For example, these values may be calculated using Equations (1)-(3) presented below. Based on these data comparisons and calculations, the system may generate one or more alarms or warnings. An alarm, warning, and/or indication may be provided to indicate that the breaker is experiencing a problem and/or may potentially experience a problem in the future. For example, the stored deviations are greater than thresholds as indicated by continuous breaker health index values, a maintenance notification may be provided to a user. At the same time, breaker performance during each breaker trip event (and possible degradation, incipient mechanical faults, mechanical fault progress, and/or mechanical fault occurrence) may be indicated using trip event breaker health index and a breaker deterioration index values completed subsequent to a breaker trip event. The breaker deterioration index may provide an indication if the breaker has deteriorated by some extent even if the other two indices indicate the breaker is healthy. Warnings, alarms, and or other types of indications may also be provided for any other reason.

The master/slave configuration employing the protection relay and switchgear monitor as described herein may provide a number of benefits. For example, the system may operate in real-time and may also operate without the need for external communication and storage infrastructure. As another example, baseline operations for a switchgear may be established automatically without technician intervention. As a third example, the system may employ predictive maintenance as opposed to (or in addition to) reactive and preventative maintenance. That is, the algorithm may be used to predict breaker failure and/or breaker degradation before they occur.

Turning to the figures, FIG. 1 illustrates an example system 100 according to an embodiment of the disclosure. The system may include at least a switchgear 102, a switchgear monitor 104, a protection relay 120, and/or a visualization system 140.

In some embodiments, the switchgear 102 may be a type of power system asset that may be desired to be monitored using the systems and methods described herein (however, it should be noted that the systems and methods described herein may also be applied to monitoring of any other type of power system asset as well). More particularly, a switchgear may be a power system asset in a power system that may house one or more circuit breakers.

In some embodiments, the switchgear monitor 104 may be a device that may specifically be used for monitoring the switchgear 102 (or any other power system asset), including at least obtaining any type of data from the switchgear 102, such as, for example, partial discharge data, temperature, and humidity data. In some cases, the switchgear monitor 104 may provide this data to the protection relay 120. The protection relay 120 may provide instructions to the switchgear monitor 104 in a master/slave and/or peer-to-peer configuration between the protection relay 120 and the switchgear monitor 104 (however, in some cases, the switchgear monitor 104 may also capture and provide data automatically without instruction from the protection relay 120). For example, the switchgear monitor 104 may include an optional current transformer/voltage transformer (CT/VT) 106, one or more light sensor(s) 108, one or more temperature monitor(s) 110, and/or one or more partial discharge (PD) and humidity monitor(s) 112. In some cases, the CT/VT 106, light sensor(s) 108, and/or temperature sensors 110 may be connected to protection relay 120 or they can be connected to switchgear monitor 104 in mutually exclusive or redundant manner. Partial discharge and humidity sensors 112 may be part of switchgear monitor 104 in most typical installations. However, other combinations are also possible as well.

In some embodiments, the protection relay 120 may be an intelligent device that may be used to control the operations of the switchgear monitor 104 in a master/slave and/or peer-to-peer configuration as mentioned above. The protection relay 120 itself may also be capable of capturing data from the switchgear 102. The protection relay 120 may include a Modbus master data collector 126 (which may collect data from one or more downstream slave devices such as monitoring and diagnostic devices using a Modbus master-slave communication protocol mechanism), a protection event and trigger mechanism 128 (which may detect when an abnormal condition, such as fault occurrence in power system, and may trigger control mechanism to operate or trip breaker), a data integrator 130, and/or a baseline storage element 132. The data integrator 130 may receive one or more data inputs from various sources, such as the switchgear monitor 104, and may provide the data to a M&D modes and threshold module 135. For example, the data integrator 130 may receive voltage and/or current measurement data 122 from the CT/VT 106, light intensity measurement data 124 from the light sensor 108, and/or any data received by the Modbus master data collector 126. The baseline storage element 132 may be local (or remote) storage that may be used to store certain data either captured by the protection relay 120 and/or switchgear monitor 104 (for example, any of the data described herein as being captured by either of these devices) or determined through calculations (for example, any calculations described with respect to FIG. 3, or any other calculations described herein). The M&D modes and threshold module 135 may receive data from the protection event and trigger mechanism 128 and the data integrator 134. The M&D modes and threshold module 135 may detect a current mode of breaker operation such as baseline or monitoring modes and may use the data collected accordingly. In baseline mode, the data collected may be used to establish healthy behavior characteristics, build data correlation model(s) and threshold computations using statistical or clustering based techniques. In monitoring mode, the data collected may be used to estimate parameters, compare with thresholds, compute breaker indices and assess its degradation level for possible maintenance action or check readiness for next trip operation or perform any component repair or plan for replacement. The M&D modes and threshold module 135 may store any of the captured and/or calculated data and/or any other information in the baseline storage 132. The M&D modes and threshold module 135 may cause a control action execution module 136 to take control action to indicate an alarm/warning to user regarding breaker condition. The control action execution module 136 may also send control signal(s) to the switchgear (for example, switchgear 102) for trip/close operations during or after fault event occurrence. In some embodiments, a control action can include, but is not limited to, tripping a breaker or otherwise disconnecting an electrical connection or circuit associated with the protection relay 120.

In some embodiments, the visualization system 140 may be, for example, a local human machine interface (HMI) within relay hardware, standalone relay software, substation HMI, Enterprise software or cloud-based system software that may be used to display breaker data/analytics/models to user or operator. A digital twin can be a 3D CAD-based visualization model of breaker or switchgear in software representing the analysis of breaker or switchgear subsystems condition in a user-friendly or appealing manner or easier way to the operator. The digital twin may provide a visually rich way to analyze breaker condition (for example, orange color code on any sub-system or part of breaker 3D model may indicate high temperature condition of that sub-system or part in actual field, red color code on any sub-system or part of breaker 3D model may indicate health degradation condition of that sub-system or part in actual field) rather than looking at large data sets). The visualization system 140 may include a digital twin 142 and/or a breaker health index 144.

Figure 2:
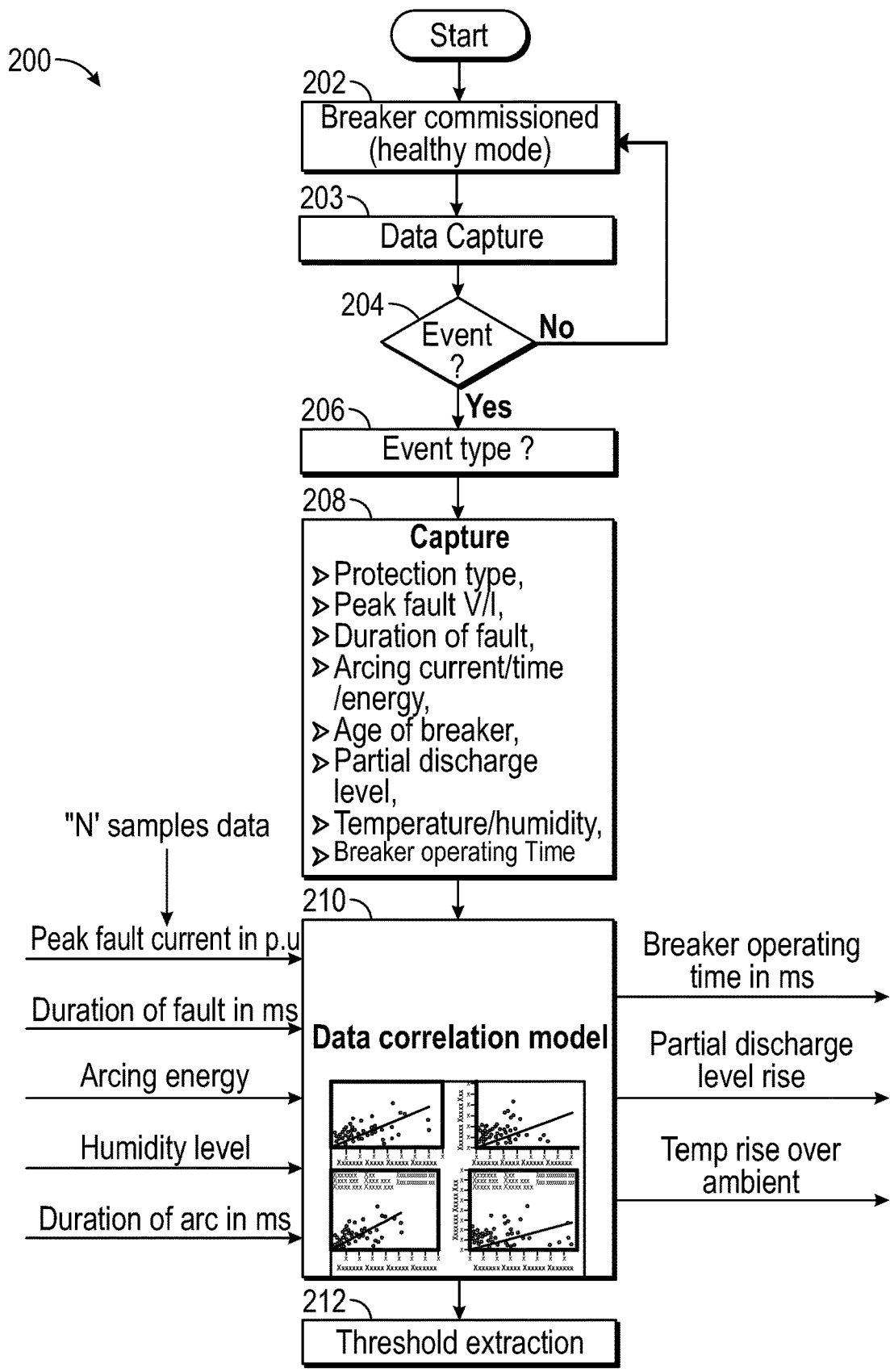
FIG. 2 depicts an example method, in accordance with one or more example embodiments of the disclosure.

FIG. 2 depicts an example method in a flowchart 200 according to one embodiment of the disclosure. The flowchart 200 may illustrate one or more operations performed during a baselining mode 202, which may take place when a breaker is initially commissioned and/or undergoing "healthy operations," which may refer to a period of operation of the during which it is not tripped. During the baselining period, data may be collected regarding the operation of the breaker. The data may be collected using the protection relay 120 and/or the switchgear monitor 104 described with respect to FIG. 1. The data may include a first set of data that may be captured continuously during this baselining period and a second set of data that may be captured once a breaker trip is detected. Examples of types of data that may be captured may be outlined in more detail below with respect to the specific operations of the flowchart 200. Once a given number of data samples have been obtained, a data correlation model may then be created. The data correlation model may be established by using artificial intelligence, machine learning, neural networks, or the like, to identify trends between captured data inputs during the baselining mode and data outputs that are produced based on those inputs. The data correlation model may then be used to monitor the breaker during the monitoring mode discussed with respect to FIG. 3 to estimate data outputs based on obtained data inputs. Additionally, the baselining mode may involve establishing thresholds for different types of data that may be monitored to identify when a breaker fault is likely to occur and/or has already occurred.

The flowchart 200 may start at operation 203. Operation 203 may involve performing data capture. For example, the data capture in operation 203 may be similar to data capture in operation 208, as well as any other data capture described herein. The flowchart 203 may then proceed to condition 204. Condition 204 may determine if a breaker event has taken place (for example a breaker trip). The flowchart 200 may then proceed to operation 206. Operation 206 may involve determining a type of event that has occurred. For example, an event may be any abnormal condition like fault in the power system such as overload, short circuit, over current, over voltage, or any other type of event. The flowchart may then proceed to operation 208, which may involve capturing data. For example, the following data (as well as any other types of data) may be captured: protection function data which triggered event, peak fault current, peak voltage, duration of fault, arcing current and/or energy within the protection relay, a partial discharge (PD) level, temperature, humidity, and/or an operating time of the breaker. In some cases, some or all of this data may be captured during every switchgear operation event. For example, for each switchgear operation event (which may include a breaker trip, for example), peak fault current, a duration of the fault, an arcing energy, a humidity level, and/or a duration of the fault may be obtained. Additionally, a breaker operating time, partial discharge level and/or rise, and a temperature rise over an ambient temperature may be obtained in light of the above data that may be captured during the same switchgear operation event. Once a given number of data samples have been captured through operation 208, a data correlation model may be established in operation 210. The data correlation model may subsequently be used for estimating certain parameters of the breaker to predict future problems with the breaker. The data correlation model may be a model that, once established, may subsequently be used to estimate a breaker operating time, partial discharge level and/or rise, and a temperature rise over an ambient temperature for any provided data inputs (for example, peak fault current, a duration of the fault, an arcing energy, a humidity level, and/or a duration of the fault). The data correlation model may be established using artificial intelligence, machine learning, neural networks, or the like, for example, and may be based on the data samples obtained during the baselining mode. Finally, after the data correlation model is established in operation 210, the flowchart 200 may proceed to operation 212, which may involve threshold extraction. Thresholds may be extracted specific to each breaker based on its design, rating, type, etc.

Figure 3:
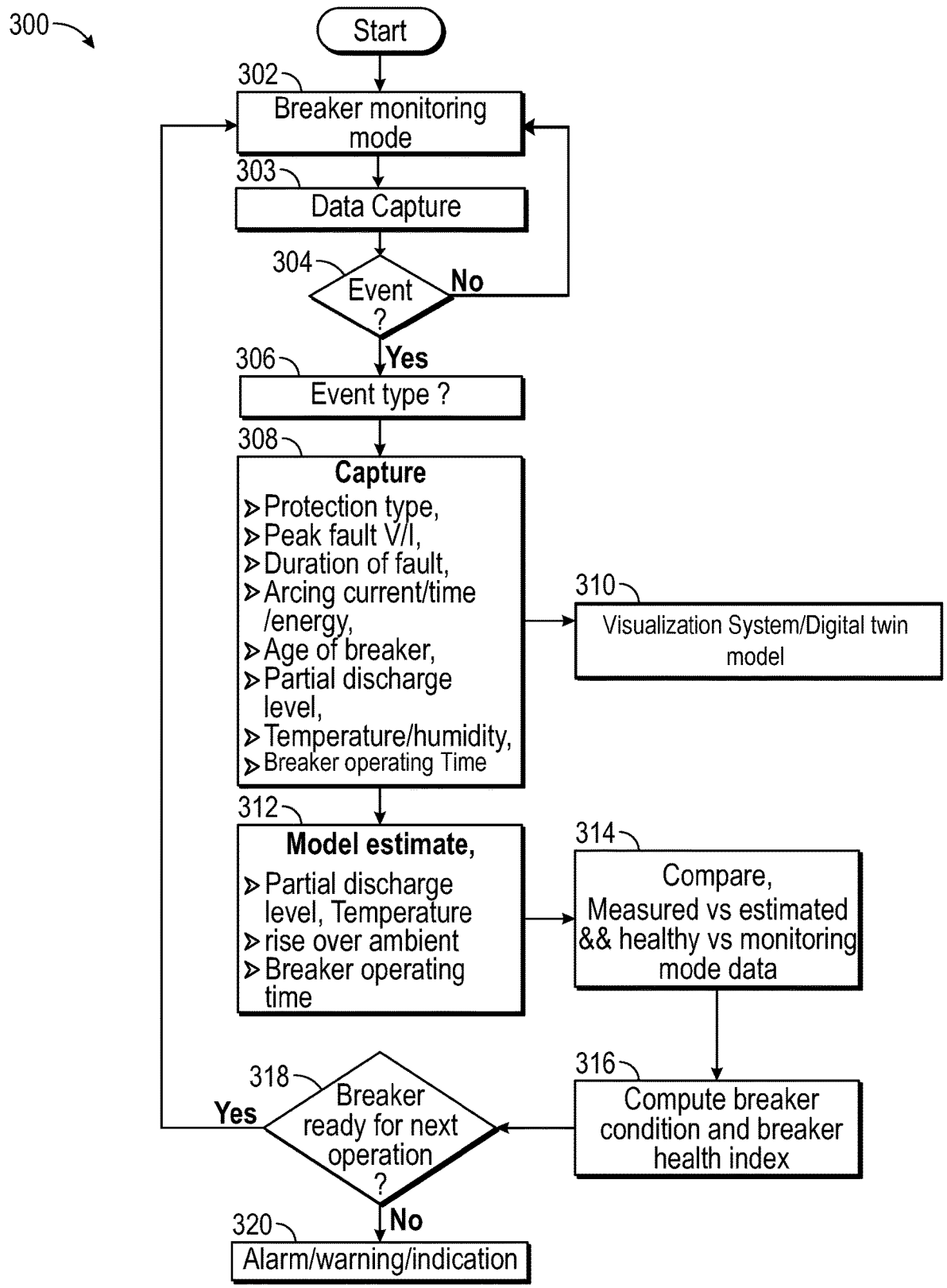
FIG. 3 depicts another example method, in accordance with one or more example embodiments of the disclosure.

FIG. 3 depicts another example method in flowchart 300, in accordance with one or more example embodiments of the disclosure. More particularly, FIG. 3 may illustrate one or more operations performed during a monitoring mode 302. The monitoring mode may involve monitoring data associated with the switchgear once the baseline has been established in order to identify when different types of faults may occur in the switchgear. As with the baselining mode described with respect to FIG. 2, the monitoring mode may be performed by the protection relay (however, in some cases, the monitoring mode may be performed by any other element described herein as well). As described above, the monitoring mode may take place after the baselining mode (for example, the baselining mode described with respect to FIG. 2 or any other baselining mode described herein).

The monitoring mode 302 may begin with operation 303. Operation 303 may involve performing data capture. For example, the data capture in operation 303 may be similar to data capture in operation 308, as well as any other data capture described herein. In some cases, the data may also be provided to the Digital twin model 310 (similar to the data captured in operation 308). The flowchart 303 may then proceed to condition 304, which may involve determining if a breaker event has occurred. For example, a breaker event may refer to a breaker trip. The flowchart 300 may then proceed to operation 306. Operation 306 may involve determining a type of event that has occurred. The flowchart 300 may proceed to operation 308, which may involve data capture. In some cases, the data captured during the monitoring mode 302 depicted in flowchart 300 may be the same or similar types of data capturing during the baselining mode described in FIG. 2. For example, types of data that may be captured may include protection type, peak fault V/I, a duration of fault, an arcing current/time/energy, an age of a breaker, a partial discharge level, a temperature, a humidity, and/or a breaker operating time. In some cases, the data may be continuously captured during this monitoring mode 302 illustrated in the flowchart 300. In some cases, the data may be captured at periodic intervals. At operation 310, the data captured in operation 308 may be provided to a digital twin model of the power system from which the data is being obtained. The digital twin model may be used to provide a visualization of data associated with any of the power system. At operation 312, the data captured in operation 308 may be provided to a data correlation model, which may be the data correlation model established in the baselining mode as described above. The data correlation model may be used to determine one or more estimated data outputs based on input data that is provided to the data correlation model. In some cases, the one or more output values may include partial discharge level, temperature rise over ambient, and/or breaking operating time. In some cases, these same data outputs that are estimated by the data correlation model may also be actually measured as well. That, is estimated and actual values may be obtained for at least partial discharge level, temperature rise over ambient, and/or breaking operating time.

In some embodiments, once the estimated and actual values may be obtained for at least partial discharge level, temperature rise over ambient, and/or breaking operating time, the flowchart 300 may proceed to operation 314. At operation 314, the measured data, estimated data, and thresholds may be compared. For example, measured breaker operating time data may be compared to expected breaker operating time data, and measured breaker operating time data may be compared to threshold levels. Additionally, measured temperature rise over ambient data may be compared to expected temperature rise over ambient data, and measured temperature rise over ambient data may be compared to threshold levels. Finally, measured partial discharge level rise data may be compared to expected partial discharge level rise data, and measured partial discharge level rise data may be compared to threshold levels.

In some embodiments, once the comparisons are performed, the flowchart 300 may proceed to operation 316. Operation 316 may involve computing different index values. For example, these index values may include a continuous breaker health index, a trip event breaker health index, and a breaker deterioration index. The continuous breaker health index may be computed continuously or at given periodic intervals and the and trip event breaker health index and breaker deterioration index may be computed during each breaker trip event. These indices may be computed using Equations (1)-(3) presented below.

$$\text{Breaker Health Index (Continous)} = \left[\left(\frac{B1}{B3}\right)*m\right] + \left[\left(\frac{C1}{C3}\right)*n\right] \quad \text{(Equation 1)}$$

where, m, n may be less than 1.0 and m+n may be equal to 1.0.

Breaker Health Index (Equation 2)

$$(\text{Trip}) = \left[\left(\frac{A1}{A3}\right)*x\right] + \left[\left(\frac{B1}{B3}\right)*y\right] + \left[\left(\frac{C1}{C3}\right)*z\right]$$

where, x, y & z may be less than 1.0 and x+y+z may be equal to 1.0.

$$\text{Breaker Deterioration Index (Trip)} = \left[\left(\frac{|A2-A3|}{|A1-A3|}\right)*x\right] + \quad \text{(Equation 3)}$$

$$\left[\left(\frac{|B2-B3|}{|B1-B3|}\right)*y\right] + \left[\left(\frac{|C2-C3|}{|C1-C3|}\right)*z\right]$$

where, x, y & z may be less than 1.0 and x+y+z may be equal to 1.0. Values associated with the variables A1-A3, B1-B3, and C1-C3 may be provided below in Table 1.

TABLE 1

| Parameter type | Breaker Op time | PD Level Rise | Temp Rise Over Ambient |
|---|---|---|---|
| Measured | A1 | B1 | C1 |
| Estimated | A2 | B2 | C2 |
| Threshold | A3 | B3 | C3 |

After these values are computed in operation 316, the flowchart 300 may proceed to condition 318. Condition 318 may involve a determination as to whether the breaker is ready for subsequent usage. If it is determined that the breaker is ready for a subsequent usage, the flowchart 300 proceeds back to the beginning and starts again with condition 304. However, if it is determined that there is a problem with the breaker, then the flowchart proceeds to operation 320. At operation 320 an alarm, warning, and/or indication is provided that the breaker is experiencing a problem and/or may potentially experience a problem in the future. For example, the stored deviations are greater than thresholds as indicated by continuous breaker health index values, a maintenance notification may be provided to a user. At the same time breaker performance during each breaker trip event (and possible degradation, incipient mechanical faults, mechanical fault progress, and/or mechanical fault occurrence) may be indicated using trip event breaker health index and a breaker deterioration index values completed subsequent to a breaker trip event. The breaker deterioration index may provide an indication if the breaker has deteriorated by some extent even if the other two indices indicate the breaker is healthy. Warnings, alarms, and or other types of indications may also be provided for any other reason.

Figure 4:
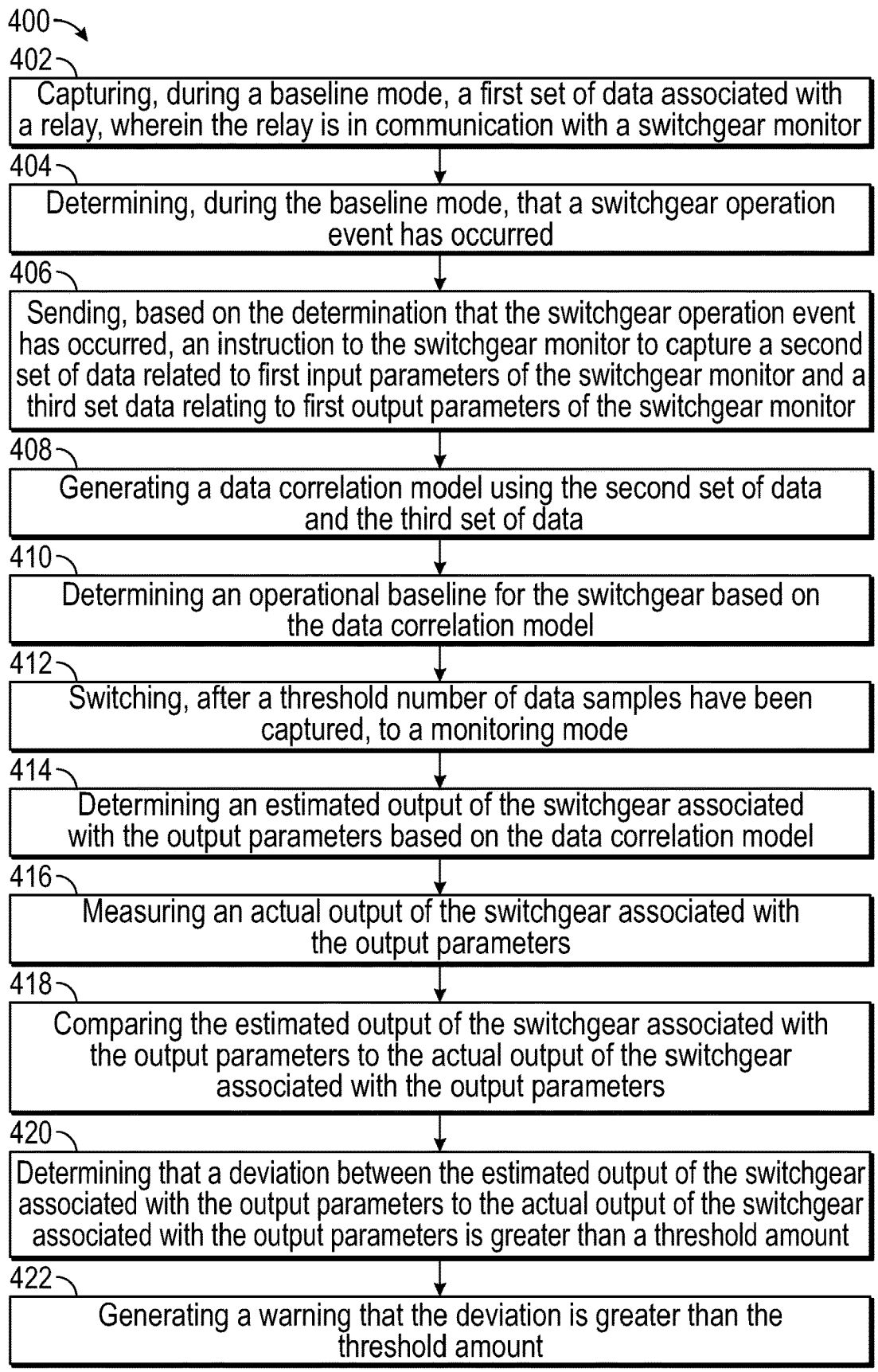
FIG. 4 depicts yet another example method, in accordance with one or more example embodiments of the disclosure.

FIG. 4 depicts yet another example method 400 according to an example embodiment of the disclosure. At block 402 in FIG. 4, the method 400 may include capturing, during a baseline mode, a first set of data associated with the protection relay. At block 404, the method 400 may include detecting that a switchgear operation event has occurred. At block 406, the method 400 may include sending, based on the determination that the switchgear operation event has occurred, an instruction to the switchgear monitor to provide a second set of data related to input parameters of the switchgear monitor and a third set data relating to output parameters of the switchgear monitor. At block 408, the method 400 may include generating a data correlation model using the second set of data and the third set of data. At block 410, the method 400 may include determining an operational baseline for the switchgear based on the data correlation model. At block 412, the method 400 may include transitioning, after a threshold number of data samples have been captured, to a monitoring mode. At block 414, the method 400 may include determining an estimated output of the switchgear associated with the output parameters based on the data correlation model. At block 416, the method 400 may include measuring an actual output of the switchgear associated with the output parameters. At block 418, the method 400 may include comparing the estimated output of the switchgear associated with the output parameters to the actual output of the switchgear associated with the output parameters. At block 420, the method 400 may include determining that a deviation between the estimated output of the switchgear associated with the output parameters to the actual output of the switchgear associated with the output parameters is greater than a threshold amount. At block 422, the method 400 may include generating a warning that the deviation is greater than the threshold amount, wherein the warning precedes a control action by the protection relay. In some embodiments, the method 400 can implement, instruct, or otherwise facilitate a control action by the protection relay. An example control action can include, but is not limited to, tripping a breaker or otherwise disconnecting an electrical connection or circuit associated with the protection relay.

In some embodiments, the first set of data comprises protection function data, peak fault current, peak voltage, duration of fault, arcing current or energy within the relay, partial discharge (PD) level, temperature, humidity, operating time of the relay, and an age of the relay. In some embodiments the input parameters comprise peak fault current, duration of fault, arcing energy, humidity, and duration of arc. In some embodiments, the relay is configured to communicate with the switchgear monitor in a peer-to-peer or master and slave configuration. In some embodiments, a switchgear operation event includes at least one of: a type of fault, a fault duration, total switchgear operations, an average open time, and average close time, a fail to open/close alarm, an arc time for an individual phase, an arc energy for an individual phase, a spring charge time, an alarm counter for relay operation, a partial discharge (PD) level, a temperature, or a humidity level.

The method 400 may also include determining, upon a trip event, a second breaker health index based on a measured breaker operation time, a threshold breaker operation time, a measured partial discharge (PD) level rise, a threshold PD level rise, a measured temperature rise over set value, and a threshold temperature rise over set value. The method may also include determining, upon a trip event, a breaker deterioration index based on a difference between an estimated breaker operational time and a threshold breaker operational time and a difference between a measured breaker operational time and the threshold breaker operational time, a difference between an estimated partial discharge (PD) level rise and a threshold PD level rise and a difference between a measured PD level rise and the threshold PD level rise, and a difference between an estimated temperature rise over set value and a threshold temperature rise over set value, and a difference between a measured temperature rise over set value and the threshold temperature rise over set value. The method may also include determining that a deviation between the estimated output of the switchgear associated with the output parameters to the actual output of the switchgear associated with the output parameters is greater than a second threshold amount, wherein the second threshold amount is greater than the threshold amount. The method 400 may also include initiating an alarm indicating that that the deviation is greater than the second threshold amount.

The operations described and depicted in the illustrative process flow of FIG. 4 may be carried out or performed in any suitable order as desired in various example embodiments of the disclosure. Additionally, in certain example embodiments, at least a portion of the operations may be carried out in parallel. Furthermore, in certain example embodiments, less, more, or different operations than those depicted in FIG. 4 may be performed.

Figure 5:
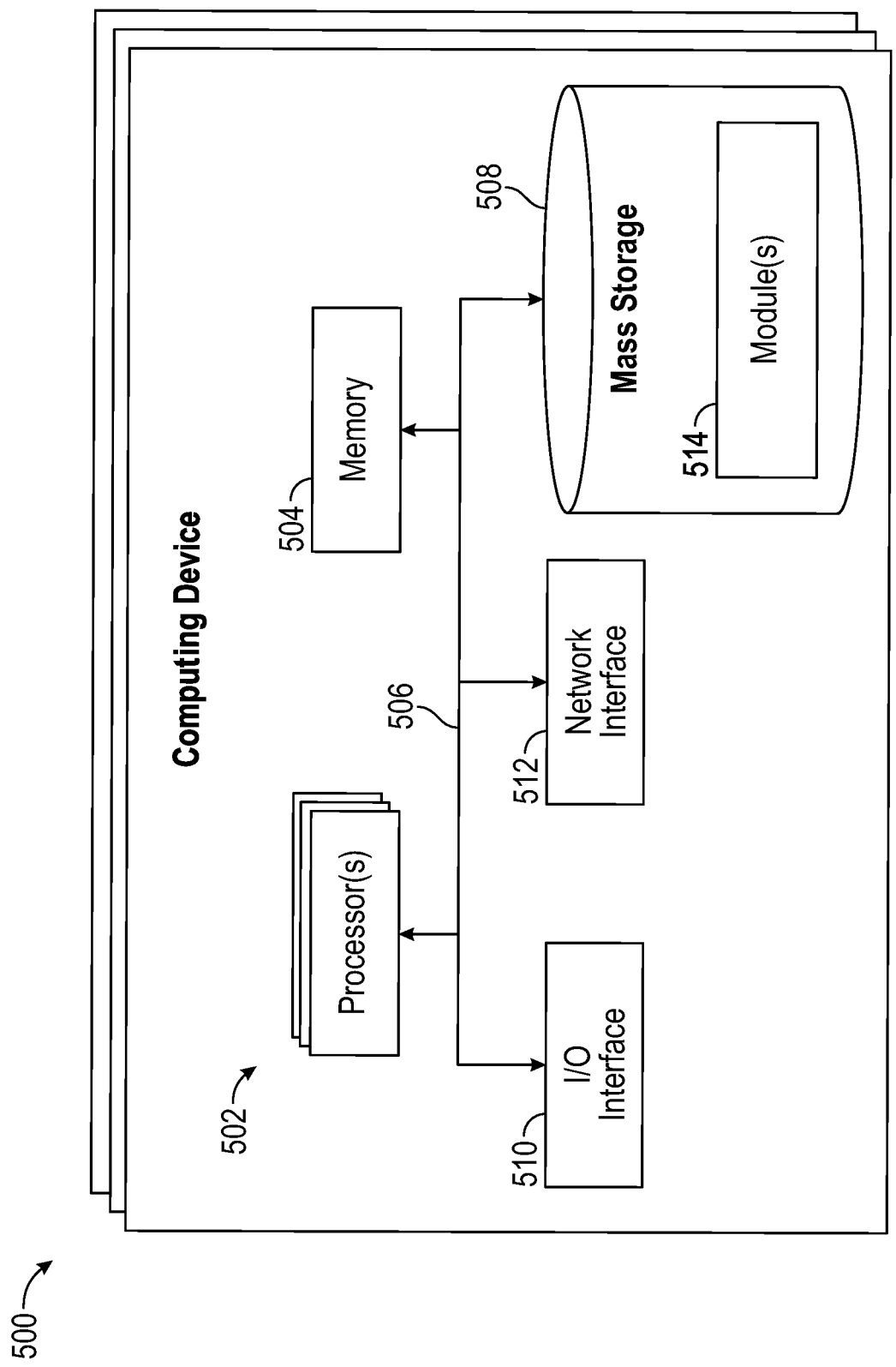
FIG. 5 depicts a schematic illustration of an example computing system and device architecture, in accordance with one or more example embodiments of the disclosure.

FIG. 5 illustrates an example computing system and device 500, in accordance with one or more embodiments of this disclosure. The computing device 500 may be representative of any number of elements described herein, such the protection relay 120, switchgear monitor 104, visualization system 140, or any other element described herein. The computing device 500 may include one or more processors 502 that execute instructions that are stored in one or more memory devices (referred to as memory 504). The instructions can be, for instance, instructions for implementing functionality described as being carried out by one or more modules and systems disclosed above or instructions for implementing one or more of the methods disclosed above. The one or more processors 502 can be embodied in, for example, a CPU, multiple CPUs, a GPU, multiple GPUs, a TPU, multiple TPUs, a multi-core processor, a combination thereof, and the like. In some embodiments, the one or more processors 502 can be arranged in a single processing device. In other embodiments, the one or more processors 502 can be distributed across two or more processing devices (e.g., multiple CPUs; multiple GPUs; a combination thereof; or the like). A processor can be implemented as a combination of processing circuitry or computing processing units (such as CPUs, GPUs, or a combination of both). Therefore, for the sake of illustration, a processor can refer to a single-core processor; a single processor with software multithread execution capability; a multi-core processor; a multi-core processor with software multithread execution capability; a multi-core processor with hardware multithread technology; a parallel processing (or computing) platform; and parallel computing platforms with distributed shared memory. Additionally, or as another example, a processor can refer to an integrated circuit (IC), an ASIC, a digital signal processor (DSP), an FPGA, a PLC, a complex programmable logic device (CPLD), a discrete gate or transistor logic, discrete hardware components, or any combination thereof designed or otherwise configured (e.g., manufactured) to perform the functions described herein.

The one or more processors 502 can access the memory 504 by means of a communication architecture 506 (e.g., a system bus). The communication architecture 506 may be suitable for the particular arrangement (localized or distributed) and types of the one or more processors 502. In some embodiments, the communication architecture 506 can include one or many bus architectures, such as a memory bus or a memory controller; a peripheral bus; an accelerated graphics port; a processor or local bus; a combination thereof, or the like. As an illustration, such architectures can include an Industry Standard Architecture (ISA) bus, a Micro Channel Architecture (MCA) bus, an Enhanced ISA (EISA) bus, a Video Electronics Standards Association (VESA) local bus, an Accelerated Graphics Port (AGP) bus, a Peripheral Component Interconnect (PCI) bus, a PCI-Express bus, a Personal Computer Memory Card International Association (PCMCIA) bus, a Universal Serial Bus (USB), and/or the like.

Memory components or memory devices disclosed herein can be embodied in either volatile memory or non-volatile memory or can include both volatile and non-volatile memory. In addition, the memory components or memory devices can be removable or non-removable, and/or internal or external to a computing device or component. Examples of various types of non-transitory storage media can include hard-disc drives, zip drives, CD-ROMs, digital versatile disks (DVDs) or other optical storage, magnetic cassettes, magnetic tape, magnetic disk storage or other magnetic storage devices, flash memory cards or other types of memory cards, cartridges, or any other non-transitory media suitable to retain the desired information and which can be accessed by a computing device.

As an illustration, non-volatile memory can include read-only memory (ROM), programmable ROM (PROM), electrically programmable ROM (EPROM), electrically erasable programmable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The disclosed memory devices or memories of the operational or computational environments described herein are intended to include one or more of these and/or any other suitable types of memory. In addition to storing executable instructions, the memory 504 also can retain data.

Each computing device 500 also can include mass storage 508 that is accessible by the one or more processors 502 by means of the communication architecture 506. The mass storage 508 can include machine-accessible instructions (e.g., computer-readable instructions and/or computer-executable instructions). In some embodiments, the machine-accessible instructions may be encoded in the mass storage 508 and can be arranged in components that can be built (e.g., linked and compiled) and retained in computer-executable form in the mass storage 508 or in one or more other machine-accessible non-transitory storage media included in the computing device 500. Such components can embody, or can constitute, one or many of the various modules disclosed herein. Such modules are illustrated as asset monitoring and diagnostic modules 514. Additionally, protocols such as Modbus, DNP, IEC 60870, IEC 61850, Profibus, Fieldbus, etc. may be used in conjunction with the systems and methods described herein.

Execution of the asset monitoring and diagnostic modules 514, individually or in combination, by the one more processors 502, can cause the computing device 500 to perform any of the operations described herein (for example, the operations described with respect to FIG. 5, as well as any other operations).

Each computing device 500 also can include one or more input/output interface devices 510 (referred to as I/O interface 510) that can permit or otherwise facilitate external devices to communicate with the computing device 500. For instance, the I/O interface 510 may be used to receive and send data and/or instructions from and to an external computing device.

The computing device 500 also includes one or more network interface devices 512 (referred to as network interface(s) 512) that can permit or otherwise facilitate functionally coupling the computing device 500 with one or more external devices. Functionally coupling the computing device 500 to an external device can include establishing a wireline connection or a wireless connection between the computing device 500 and the external device. The network interface devices 512 can include one or many antennas and a communication processing device that can permit wireless communication between the computing device 500 and another external device. For example, between a vehicle and a smart infrastructure system, between two smart infrastructure systems, etc. Such a communication processing device can process data according to defined protocols of one or several radio technologies. The radio technologies can include, for example, 3G, Long Term Evolution (LTE), LTE-Advanced, 5G, IEEE 802.11, IEEE 802.16, Bluetooth, ZigBee, near-field communication (NFC), and the like. The communication processing device can also process data according to other protocols as well, such as vehicle-to-infrastructure (V2I) communications, vehicle-to-vehicle (V2V) communications, and the like. The network interface(s) 512 may also be used to facilitate peer-to-peer ad-hoc network connections as described herein.

As used in this application, the terms "environment," "system," "unit," "module," "architecture," "interface," "component," and the like refer to a computer-related entity or an entity related to an operational apparatus with one or more defined functionalities. The terms "environment," "system," "module," "component," "architecture," "interface," and "unit," can be utilized interchangeably and can be generically referred to functional elements. Such entities may be either hardware, a combination of hardware and software, software, or software in execution. As an example, a module can be embodied in a process running on a processor, a processor, an object, an executable portion of software, a thread of execution, a program, and/or a computing device. As another example, both a software application executing on a computing device and the computing device can embody a module. As yet another example, one or more modules may reside within a process and/or thread of execution. A module may be localized on one computing device or distributed between two or more computing devices. As is disclosed herein, a module can execute from various computer-readable non-transitory storage media having various data structures stored thereon. Modules can communicate via local and/or remote processes in accordance, for example, with a signal (either analogic or digital) having one or more data packets (e.g., data from one component interacting with another component in a local system, distributed system, and/or across a network such as a wide area network with other systems via the signal).

As yet another example, a module can be embodied in or can include an apparatus with a defined functionality provided by mechanical parts operated by electric or electronic circuitry that is controlled by a software application or firmware application executed by a processor. Such a processor can be internal or external to the apparatus and can execute at least part of the software or firmware application. Still, in another example, a module can be embodied in or can include an apparatus that provides defined functionality through electronic components without mechanical parts. The electronic components can include a processor to execute software or firmware that permits or otherwise facilitates, at least in part, the functionality of the electronic components.

In some embodiments, modules can communicate via local and/or remote processes in accordance, for example, with a signal (either analog or digital) having one or more data packets (e.g., data from one component interacting with another component in a local system, distributed system, and/or across a network such as a wide area network with other systems via the signal). In addition, or in other embodiments, modules can communicate or otherwise be coupled via thermal, mechanical, electrical, and/or electromechanical coupling mechanisms (such as conduits, connectors, combinations thereof, or the like). An interface can include input/output (I/O) components as well as associated processors, applications, and/or other programming components.

Further, in the present specification and annexed drawings, terms such as "store," "storage," "data store," "data storage," "memory," "repository," and substantially any other information storage component relevant to the operation and functionality of a component of the disclosure, refer to memory components, entities embodied in one or several memory devices, or components forming a memory device. It is noted that the memory components or memory devices described herein embody or include non-transitory computer storage media that can be readable or otherwise accessible by a computing device. Such media can be implemented in any methods or technology for storage of information, such as machine-accessible instructions (e.g., computer-readable instructions), information structures, program modules, or other information objects.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language generally is not intended to imply that features, elements, and/or operations are in any way required for one or more implementations or that one or more implementations necessarily include logic for deciding, with or without user input or prompting, whether these features, elements, and/or operations are included or are to be performed in any particular implementation.

What has been described herein in the present specification and annexed drawings includes examples of systems, devices, techniques, and computer program products that, individually and in combination, permit the automated provision of an update for a vehicle profile package. It is, of course, not possible to describe every conceivable combination of components and/or methods for purposes of describing the various elements of the disclosure, but it can be recognized that many further combinations and permutations of the disclosed elements are possible. Accordingly, it may be apparent that various modifications can be made to the disclosure without departing from the scope thereof. In addition, or as an alternative, other embodiments of the disclosure may be apparent from consideration of the specification and annexed drawings, and practice of the disclosure as presented herein. It is intended that the examples put forth in the specification and annexed drawings be considered, in all respects, as illustrative and not limiting. Although specific terms are employed herein, they are used in a generic and descriptive sense only and not for purposes of limitation.

That which is claimed is:

1. A system comprising:
a monitor device in communication with a switchgear; and
a protection relay in communication with the monitor device and configured to, using a processor:
capture, during a baseline mode, a first set of data associated with the protection relay, wherein the first set of data comprises protection function data, peak fault current, peak voltage, duration of fault, arcing current or energy within the protection relay, partial discharge (PD) level, temperature, humidity, operating time of the protection relay, and an age of the protection relay;
detect, based on the first set of data and during the baseline mode, that a switchgear fault event has occurred;
capture, based on the detection of the switchgear fault event has occurred, a second set of data indicative of a type of protection that triggered the switchgear fault event and characteristics of the switchgear fault event, and a third set of data indicative of operating conditions of the relay during the switchgear fault event;
generate a data correlation model using the second set of data and the third set of data, the data correlation model associated with predicting a future switchgear fault event that has not yet occurred;
determine an operational baseline for the switchgear based on the data correlation model using an analysis of the switchgear fault event based on the second set of data and the third set of data, the operational baseline associated with predicting the future switchgear fault event;
transition, after a threshold number of data samples have been captured, to a monitoring mode;
determine an estimated output of the switchgear associated with output parameters of the monitor device based on the data correlation model;
measure an actual output of the switchgear associated with the output parameters;
compare the estimated output of the switchgear associated with the output parameters to the actual output of the switchgear associated with the output parameters;
determine that a deviation between the estimated output of the switchgear associated with the output parameters to the actual output of the switchgear associated with the output parameters is greater than a threshold amount indicative of the future switchgear fault event;
predict, based on the deviation being greater than the threshold amount, that the future switchgear fault event will occur; and
generate a warning that the future switchgear fault event has been predicted to occur, wherein the warning precedes a control action by the protection relay.

2. The system of claim 1, wherein the characteristics of the switchgear fault event comprise the peak fault current, the duration of fault, the arcing current or energy, the humidity, and duration of arc.

3. The system of claim 1, wherein the operating conditions of the relay during the switchgear fault event comprise switchgear operating duration, partial discharge (PD) level and rise, and temperature rise over set value.

4. The system of claim 1, wherein the processor is further configured to periodically determine a first breaker health index based on a measured partial discharge (PD) level rise, a threshold PD level rise, a measured temperature rise over set value, and a threshold temperature rise over set value.

5. The system of claim 1, wherein
the processor is further configured to determine, upon a trip event, a first breaker health index based on a measured breaker operation time, a threshold breaker operation time, a measured partial discharge (PD) level rise, a threshold PD level rise, a measured temperature rise over set value, and a threshold temperature rise over set value.

6. The system of claim 1, wherein the processor is further configured to determine, upon a trip event, a breaker deterioration index based on a difference between an estimated breaker operational time and a threshold breaker operational time and a difference between a measured breaker operational time and the threshold breaker operational time, a difference between an estimated partial discharge (PD) level rise and a threshold PD level rise and a difference between a measured PD level rise and the threshold PD level rise, and a difference between an estimated temperature rise over set value and a threshold temperature rise over set value, and a difference between a measured temperature rise over set value and the threshold temperature rise over set value.

7. The system of claim 1, wherein the protection relay is configured to communicate with the monitor device in a peer-to-peer or master and slave configuration.

8. The system of claim 1, wherein the threshold amount is a first threshold amount, and wherein the processor is further configured to:
determine that the deviation between the estimated output of the switchgear associated with the output parameters to the actual output of the switchgear associated with the output parameters is greater than a second threshold amount, wherein the second threshold amount is greater than the threshold amount; and
initiate an alarm indicating that the deviation is greater than the second threshold amount.

9. The system of claim 1, wherein a switchgear fault event includes at least one of: a type of fault, a fault duration, total switchgear operations, an average open time, and average close time, a fail to open/close alarm, an arc time for an individual phase, an arc energy for an individual phase, a spring charge time, an alarm counter for relay operation, a PD level, a temperature, or a humidity level.

10. The system of claim 1, wherein predicting, using the data correlation model, the future switchgear fault event that has not yet occurred is based on the switchgear fault event detected during the baseline mode.

11. A method comprising:
capturing, using at least one processor, during a baseline mode, a first set of data associated with a protection relay, wherein the first set of data comprises at least two of protection function data, peak fault current, peak voltage, duration of fault, arcing current or energy within the protection relay, partial discharge (PD) level, temperature, humidity, operating time of the protection relay, and an age of the protection relay;
detecting, using the at least one processor, based on the first set of data and during the baseline mode, that a switchgear fault event has occurred;
capturing, using the at least one processor, based on the detection of the switchgear fault event, a second set of data indicative of a type of protection that triggered the switchgear fault event and characteristics of the switch gear fault event, and a third set of data indicative of operating conditions of the relay during the switchgear fault event;
generating, using the at least one processor, a data correlation model using the second set of data and the third set of data, the data correlation model associated with predicting a future switchgear fault event that has not yet occurred;
determining, using the at least one processor, an operational baseline for the switchgear based on the data correlation model using an analysis of the switchgear fault event based on the second set of data and the third set of data, the operational baseline associated with predicting the future switchgear fault event;
transitioning, using the at least one processor, after a threshold number of data samples have been captured, to a monitoring mode;
determining, using the at least one processor, an estimated output of the switchgear associated with output parameters of a monitor device based on the data correlation model;
measuring, using the at least one processor, an actual output of the switchgear associated with the output parameters;
comparing, using the at least one processor, the estimated output of the switchgear associated with the output parameters to the actual output of the switchgear associated with the output parameters;
determining, using the at least one processor, that a deviation between the estimated output of the switchgear associated with the output parameters to the actual output of the switchgear associated with the output parameters is greater than a threshold amount indicative of the future switchgear fault event;
predicting, using the at least one processor, based on the deviation being greater than the threshold amount, that the future switchgear fault event will occur; and
generating, using the at least one processor, a warning that the future switchgear fault event has been predicted to occur, wherein the warning precedes a control action by the protection relay.

12. The method of claim 11, wherein the characteristics of the switchgear fault event comprise the peak fault current, the duration of fault, the arcing current or energy, the humidity, and duration of arc.

13. The method of claim 11, wherein the operating conditions of the relay during the switchgear fault event comprise switchgear operating duration, partial discharge (PD) level and rise, and temperature rise over set value.

14. The method of claim 11, further comprising periodically determining a first breaker health index based on a measured partial discharge (PD) level rise, a threshold PD level rise, a measured temperature rise over set value, and a threshold temperature rise over set value.

15. The method of claim 11, further comprising
determining, upon a trip event, a first breaker health index based on a measured breaker operation time, a threshold breaker operation time, a measured partial discharge (PD) level rise, a threshold PD level rise, a measured temperature rise over set value, and a threshold temperature rise over set value.

16. The method of claim 11, further comprising determining, upon a trip event, a breaker deterioration index based on a difference between an estimated breaker operational time and a threshold breaker operational time and a difference between a measured breaker operational time and the threshold breaker operational time, a difference between an estimated partial discharge (PD) level rise and a threshold PD level rise and a difference between a measured PD level rise and the threshold PD level rise, and a difference between an estimated temperature rise over set value and a threshold temperature rise over set value, and a difference between a measured temperature rise over set value and the threshold temperature rise over set value.

17. The method of claim 11, wherein the protection relay is configured to communicate with the monitor device in a peer-to-peer or master and slave configuration.

18. The method of claim 11, wherein the threshold amount is a first threshold amount, the method further comprising:
determining that the deviation between the estimated output of the switchgear associated with the output parameters to the actual output of the switchgear associated with the output parameters is greater than a second threshold amount, wherein the second threshold amount is greater than the threshold amount; and
initiating an alarm indicating that the deviation is greater than the second threshold amount.

19. The method of claim 11, wherein a switchgear fault event includes at least one of: a type of fault, a fault duration, total switchgear operations, an average open time, and average close time, a fail to open/close alarm, an arc time for an individual phase, an arc energy for an individual phase, a spring charge time, an alarm counter for relay operation, a PD level, a temperature, or a humidity level.

20. The method of claim 11, wherein predicting, using the data correlation model, the future switchgear fault event that has not yet occurred is based on the switchgear fault event detected during the baseline mode.

* * * * *